(12) United States Patent
Mane et al.

(10) Patent No.: US 11,862,783 B2
(45) Date of Patent: Jan. 2, 2024

(54) METAL FLUORIDE PASSIVATION COATINGS PREPARED BY ATOMIC LAYER DEPOSITION FOR LI-ION BATTERIES

(71) Applicant: UCHICAGO ARGONNE, LLC, Chicago, IL (US)

(72) Inventors: Anil U. Mane, Naperville, IL (US); Jeffrey W. Elam, Elmhurst, IL (US); Joong Sun Park, Woodridge, IL (US); Jason R. Croy, Bolingbrook, IL (US)

(73) Assignee: UCHICAGO ARGONNE, LLC, Chicago, IL (US)

(*) Notice: Subject to any disclaimer, the term of this patent is extended or adjusted under 35 U.S.C. 154(b) by 0 days.

(21) Appl. No.: 17/404,055

(22) Filed: Aug. 17, 2021

(65) Prior Publication Data

US 2022/0085348 A1 Mar. 17, 2022

Related U.S. Application Data

(62) Division of application No. 16/208,381, filed on Dec. 3, 2018, now Pat. No. 11,121,355, which is a division
(Continued)

(51) Int. Cl.
  *H01M 4/04* (2006.01)
  *H01M 4/131* (2010.01)
  (Continued)

(52) U.S. Cl.
  CPC ........... *H01M 4/0421* (2013.01); *C23C 16/30* (2013.01); *C23C 16/45531* (2013.01);
  (Continued)

(58) Field of Classification Search
  CPC .. H01M 4/0421; H01M 4/131; H01M 4/1391; H01M 4/366; H01M 4/505;
  (Continued)

(56) References Cited

U.S. PATENT DOCUMENTS 8,921,799 B2   12/2014   Elam et al.
2007/0015048 A1*  1/2007   Lee ................... H01M 10/0525
                                                        429/118
(Continued)

OTHER PUBLICATIONS

Appapillai, et al., "Microstructure of LiCoO2 with and without "AlPO4" Nanoparticle Coating:? Combined STEM and XPS Studies," Chemistry of Materials 19(23), pp. 5748-5757 (2007).
(Continued)

*Primary Examiner* — Alexander Usyatinsky
(74) *Attorney, Agent, or Firm* — Foley & Lardner LLP (57) ABSTRACT

The fabrication of robust interfaces between transition metal oxides and non-aqueous electrolytes is one of the great challenges of lithium ion batteries. Atomic layer deposition (ALD) of aluminum tungsten fluoride ($AlW_xF_y$) improves the electrochemical stability of $LiCoO_2$. $AlW_xF_y$ thin films were deposited by combining trimethylaluminum and tungsten hexafluoride. in-situ quartz crystal microbalance and transmission electron microscopy studies show that the films grow in a layer-by-layer fashion and are amorphous nature. Ultrathin $AlW_xF_y$ coatings (<10 Å) on $LiCoO_2$ significantly enhance stability relative to bare $LiCoO_2$ when cycled to 4.4 V. The coated LiCoO2 exhibited superior rate capability (up to 400 mA/g) and discharge capacities at a current of 400 mA/g were 51% and 92% of the first cycle capacities for the bare and $AlW_xF_y$ coated materials. These results open new possibilities for designing ultrathin and electrochemically robust coatings of metal fluorides via ALD to enhance the stability of Li-ion electrodes.

8 Claims, 13 Drawing Sheets

Related U.S. Application Data of application No. 14/693,719, filed on Apr. 22, 2015, now Pat. No. 10,177,365.

(60) Provisional application No. 62/128,944, filed on Mar. 5, 2015.

(51) Int. Cl.

| C23C 16/455 | (2006.01) |
|---|---|
| H01M 4/1391 | (2010.01) |
| H01M 4/62 | (2006.01) |
| H01M 4/36 | (2006.01) |
| C23C 16/30 | (2006.01) |
| H01M 4/505 | (2010.01) |
| H01M 10/0525 | (2010.01) |

(52) U.S. Cl.
CPC ....... *C23C 16/45555* (2013.01); *H01M 4/131* (2013.01); *H01M 4/1391* (2013.01); *H01M 4/366* (2013.01); *H01M 4/505* (2013.01); *H01M 4/628* (2013.01); *H01M 10/0525* (2013.01)

(58) Field of Classification Search
CPC ..... H01M 4/628; H01M 10/052; C23C 16/30; C23C 16/45531; C23C 16/45555
See application file for complete search history.

(56) References Cited

U.S. PATENT DOCUMENTS

| 2009/0087362 | A1* | 4/2009 | Sun | C01G 45/1242 |
|---|---|---|---|---|
| | | | | 423/179.5 |
| 2009/0155590 | A1* | 6/2009 | Kelder | H01M 4/1391 |
| | | | | 427/213 |
| 2012/0187305 | A1* | 7/2012 | Elam | C23C 16/45555 |
| | | | | 257/E31.086 |
| 2012/0196186 | A1 | 8/2012 | Richard | |
| 2013/0335190 | A1 | 12/2013 | Elam et al. | |
| 2014/0113197 | A1* | 4/2014 | Xiao | H01M 4/485 |
| | | | | 429/231.1 |
| 2014/0302392 | A1 | 10/2014 | Li et al. | |
| 2015/0180023 | A1 | 6/2015 | Xiao et al. | |
| 2015/0364747 | A1* | 12/2015 | Elam | H01M 10/0562 |
| | | | | 204/192.1 |
| 2016/0260962 | A1 | 9/2016 | Mane et al. | |

OTHER PUBLICATIONS

Burton, et al., "Atomic Layer Deposition of MgO Using Bis(ethylcyclopentadienyl)magnesium and H2O," The Journal of Physical Chemistry C 113(5), pp. 1939-1946 (2009).
Chen & Dahn, "Improving the Capacity Retention of LiCoO2 Cycled to 4.5 V by Heat-Treatment," Electrochemical and Solid-State Letters 7(1), pp. A11-A14 (2004).
Chen & Dahn, "Studies of LiCoO2 Coated with Metal Oxides," Electrochemical and Solid-State Letters 6(11), pp. A221-A224 (2003).
Chen, et al., "Advanced cathode materials for lithium-ion batteries," MRS Bulletin 36(7), pp. 498-505 (2011).
Chen, et al., "Atomic layer-deposited tunnel oxide stabilizes silicon photoanodes for water oxidation," Nature Materials 10, pp. 539-544 (2011).
Chen, et al., "Role of surface coating on cathode materials for lithium-ion batteries," Journal of Materials Chemistry 20, pp. 7606-7612 (2010).
Cho, et al., "Zero-Strain Intercalation Cathode for Rechargeable Li-Ion Cell," Angewandte Chemie International Edition 40(18), pp. 3367-3369 (2001).
Comstock & Elam, "Mechanistic Study of Lithium Aluminum Oxide Atomic Layer Deposition," The Journal of Physical Chemistry C 117(4), pp. 1677-1683 (2013).

Elam, et al., "Synthesis, Characterization, and Application of Tunable Resistance Coatings Prepared by Atomic Layer Deposition," ECS Transactions 58(10), pp. 249-2261 (2013).
Final Office Action on U.S. Appl. No. 14/693,719 dated Jul. 10, 2018.
George, "Atomic layer deposition: an overview," Chemical Reviews 110(1), pp. 111-131 (2010).
Jung, et al., "Enhanced Stability of LiCoO2 Cathodes in Lithium-Ion Batteries Using Surface Modification by Atomic Layer Deposition," Journal of The Electrochemical Society 157(1), pp. A75-A81 (2010).
Jung, et al., "Ultrathin Direct Atomic Layer Deposition on Composite Electrodes for Highly Durable and Safe Li-Ion Batteries," Advanced Materials 22(19), pp. 2172-2176 (2010).
Klug, et al., "Atomic Layer Deposition of Amorphous Niobium Carbide-Based Thin Film Superconductors," The Journal of Physical Chemistry C 115(50), pp. 25063-25071 (2011).
Lee, et al., "Roles of Surface Chemistry on Safety and Electrochemistry in Lithium Ion Batteries," Accounts of Chemical Research 46(5), pp. 1161-1170 (2013).
Li, et al., "Atomic layer deposition of solid-state electrolyte coated cathode materials with superior high-voltage cycling behavior for lithium ion battery application," Energy & Environmental Science 7, pp. 768-778 (2014).
Li, et al., "Cathode materials modified by surface coating for lithium ion batteries," Electrochimica Acta 51(19), pp. 3872-3883 (2006).
Liu, et al., "Atomic Layer Deposition of Lithium Tantalate Solid-State Electrolytes," The Journal of Physical Chemistry C 117(39), pp. 20260-20267 (2013).
Long, et al., "Advances in Stabilizing 'Layered-Layered' xLi2MnO3 (1-x)LiMO2 (M=Mn, Ni, Co) Electrodes with a Spinel Component," Journal of The Electrochemical Society 161(14), pp. A2160-A2167 (2014).
Long, et al., "Enabling High-Energy, High-Voltage Lithium-Ion Cells: Standardization of Coin-Cell Assembly, Electrochemical Testing, and Evaluation of Full Cells," Journal of The Electrochemical Society 163(14), pp. A2999-A3009 (2016).
Mane & Elam, "Atomic Layer Deposition of W:Al2O3 Nanocomposite Films with Tunable Resistivity," Chemical Vapor Deposition 19(4-6), pp. 186-193 (2013).
Mane, et al., "Unusual Atomic Layer Deposition of Bi-Metallic Fluorides and Oxyfluorides," ALD 2014 Conference, 17 pages (2014).
Mantymaki, et al., "Atomic Layer Deposition of LiF Thin Films from Lithd, Mg(thd)2, and TiF4 Precursors," Chemistry of Materials 25(9), pp. 1656-1663 (2013).
Notice of Allowance for U.S. Appl. No. 16/208,381, dated May 19, 2021.
Park, et al., "Amorphous Metal Fluoride Passivation Coatings Prepared by Atomic Layer Deposition on LiCoO2 for Li-Ion Batteries," Chemistry of Materials 27(6), pp. 1917-1920 (2015).
Park, et al., "Ultrathin Lithium-Ion Conducting Coatings for Increased Interfacial Stability in High Voltage Lithium-Ion Batteries," Chemistry of Materials 26(10), pp. 3128-3134 (2014).
Pilvi, et al., "Atomic layer deposition process with TiF4 as a precursor for depositing metal fluoride thin films," Applied Optics 47(13), pp. C271-C274 (2008).
Plivi, et al., "Atomic Layer Deposition of MgF2 Thin Films Using TaF5 as a Novel Fluorine Source," Chemistry of Materials 20(15), pp. 5023-5028 (2008).
Sun, et al., "AlF3-Coating to Improve High Voltage Cycling Performance of Li[Ni1/3Co1/3Mn1/3]O2 Cathode Materials for Lithium Secondary Batteries," Journal of the Electrochemical Society 154(3), pp. A168-A172 (2007).
Sun, et al., "Significant improvement of high voltage cycling behavior AlF3-coated LiCoO2 cathode," Electrochemistry Communications 8(5), pp. 821-826 (2006).
Sun, et al., "The Role of AlF3 Coatings in Improving Electrochemical Cycling of Li-Enriched Nickel-Manganese Oxide Electrodes for Li-Ion Batteries," Advanced Materials 24(9), pp. 1192-1196 (2012).
Tarascon & Armand, "Issues and challenges facing rechargeable lithium batteries," Nature 414, pp. 359-367 (2001).

(56) References Cited

OTHER PUBLICATIONS

Thackeray, et al., "Electrical energy storage for transportation—approaching the limits of, and going beyond, lithium-ion batteries," Energy & Environmental Science 5, pp. 7854-7863 (2012).

Tressaud, et al., "Switchable hydrophobic-hydrophilic layer obtained onto porous alumina by plasma-enhanced fluorination," Science in China Series E: Technological Sciences 54(1), pp. 104-110 (2009).

Wang, et al., "TEM Study of Electrochemical Cycling-Induced Damage and Disorder in LiCoO2 Cathodes for Rechargeable Lithium Batteries," Journal of the Electrochemical Society 146(2), pp. 473-480 (1999).

Yang & Tarascon, "Towards systems materials engineering," Nature Materials 11, pp. 560-563 (2012).

Ylilammi & Ranta-Aho, "Metal Fluoride Thin Films Prepared by Atomic Layer Deposition," Journal of the Electrochemical Society 141(5), pp. 1278-1284 (1994).

Zhang, et al., "Structural and Electrochemical Study of Al2O3 and TiO2 Coated Li1.2Ni0.13Mn0.54Co0.13O2 Cathode Material Using ALD," Advanced Energy Materials 3(10), pp. 1299-1307 (2013).

\* cited by examiner

METAL FLUORIDE PASSIVATION COATINGS PREPARED BY ATOMIC LAYER DEPOSITION FOR LI-ION BATTERIES

CROSS-REFERENCE TO RELATED APPLICATIONS

This application is a divisional of U.S. patent application Ser. No. 16/208,381, filed on Dec. 3, 2018, which is the divisional of U.S. patent application Ser. No. 14/693,719, filed on Apr. 22, 2015, which claims the benefit of U.S. Provisional Application No. 62/128,944 filed on Mar. 5, 2015, which are hereby incorporated by reference in their entireties.

STATEMENT OF GOVERNMENT INTEREST

This invention was made with government support under Contract No. DE-AC02-06CH11357 awarded by the United States Department of Energy to UChicago Argonne, LLC, operator of Argonne National Laboratory. The government has certain rights in the invention.

FIELD OF THE INVENTION

The present invention generally relates deposited coatings, specifically to atomic layer deposition of metal fluoride coatings.

BACKGROUND OF THE INVENTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and made part of this disclosure.

The fabrication of robust interfaces between electrodes and electrolytes that satisfy the application-dependent, electrochemical demands of various systems is one of the great challenges of interfacial science. In particular, irreversible reactions between non-aqueous electrolytes and metal oxides are often considered to be a rate-limiting step adversely affecting the overall performance of lithium-ion (Li-ion) batteries. Li-Ion batteries, in general, suffer irreversible capacity losses during high voltage operation due, in part, to corrosion of active materials in the acidic electrolyte as well as electrolyte decomposition. Small levels of moisture (~20-100 ppm) present in battery-grade electrolytes can react with lithium salts (e.g. $LiPF_6$) to generate hydrofluoric acid (HF). HF subsequently attacks the surfaces of electrode materials causing transition metal dissolution and migration to the negative electrode. Furthermore, surface layers can form as a result of electrolyte oxidation at high voltages which impede Li-ion diffusion.

Coating electrode surfaces with metal oxides such as $Al_2O_3$, MgO, ZnO, and $TiO_2$ has proven to be effective in mitigating irreversible side reactions. These metal oxides coatings, however, are also susceptible to HF attack and may not be stable over long-term cycling, converting partially to metal fluorides when scavenging HF as reported earlier. Furthermore, byproducts of these reactions generate additional water in the electrolyte again making electrode/electrolyte interfaces unstable. In addition, the high electronegativity of fluorine results in strongly bonded cations relative to oxygen and should be beneficial in limiting unwanted surface reactions. In particular, $AlF_3$-coated positive electrodes ($LiCoO_2$, $LiNi_{1/3}Mn_{1/3}CO_{1/3}O_2$, $Li[Li_{0.19}Mn_{0.57}Ni_{0.16}Co_{0.08}]O_2$, etc.) have demonstrated significant improvements in cycling stability and safety when $AlF_3$ is applied via solution-based routes. The $AlF_3$ layers provide some resistivity to HF attack, but are insulating resulting in decreased cathode performance.

However, wet-chemical processes, as well as standard physical vapor deposition (PVD), have limitations. Non-uniform thicknesses and/or compositional variation of coating layers can arise from the directional nature of deposition (PVD) or by the secondary heating steps required for solution-based routes. As thickness can alter the impact the layer has on the underlying cathode performance, the ability to finely tune and control thickness is important.

SUMMARY OF THE INVENTION

One embodiment of the invention relates to a method of preparing a metal fluoride passivation coating on a cathode comprising: performing an atomic layer deposition cycles of TMA at a first deposition temperature between 50° C. and 300° C.; and performing b atomic layer deposition cycles of $WF_6$ at a second deposition temperature between 50° C. and 300° C.

Another embodiment relates to a battery comprising a $LiCoO_2$ cathode core; a metal fluoride passivation coating conformally coated on the cathode core; the metal fluoride passivation coating consisting essentially of $AlW_xF_yC_z$ wherein x and y are greater than 0.

Additional features, advantages, and embodiments of the present disclosure may be set forth from consideration of the following detailed description, drawings, and claims. Moreover, it is to be understood that both the foregoing summary of the present disclosure and the following detailed description are exemplary and intended to provide further explanation without further limiting the scope of the present disclosure claimed.

BRIEF DESCRIPTION OF THE DRAWINGS

The foregoing and other objects, aspects, features, and advantages of the disclosure will become more apparent and better understood by referring to the following description taken in conjunction with the accompanying drawings, in which:

FIGS. 2 A-B illustrates (FIG. 2A) First-cycle voltage profiles of bare (black) and $AlW_xF_y$-coated (red) $LiCoO_2$ between 4.4-2.5 V at 20 mA/g; the inset shows first- and second-charge voltage profiles of the coated $LiCoO_2$ and (FIG. 2B) Discharge capacities of bare (black) and coated (red) $Li^+/LiCoO_2$ cells at a current rate of 20 mA/g between 4.4-2.5 V; the inset shows Coulombic efficiencies of the samples.

DETAILED DESCRIPTION OF THE PREFERRED EMBODIMENTS

Atomic layer deposition (ALD) is a modified form of chemical vapor deposition (CVD) that uses the self-limiting nature of specific precursors to deposit films in a layer-by-layer fashion. ALD is particularly well-suited for coating electrode surfaces in that a conformal coating can be applied with precise control of thickness and composition. Previous studies on ALD-coated electrodes have primarily focused on metal oxides such as Al$_2$O$_3$, TiO$_2$, LiAlO$_2$, and LiTaO$_3$ because the ALD chemistry of these oxides is well known. Metal fluoride growth by ALD is complex and challenging, mainly due to the lack of suitable fluorine precursors. For example, HF, a highly aggressive chemical etching agent, has been used to deposit CaF$_2$, ZnF$_2$, and SrF$_2$. More recently, alternative ALD chemistries have been developed such as MgF$_2$ and LiF ALD using either TaF$_5$ or TiF$_4$ as the fluorine precursor for optical applications. However, the substrate temperatures in these cases were 300-400° C.; high enough to degrade battery electrode laminates containing polymeric binders. Another potential limitation of AlF$_3$ for Li-Ion batteries is that it is a wide-bandgap dielectric and hence electrically insulating. Although still promising as a coating, methods to enhance the material's conductivity while maintaining its superb resistance to chemical attack could be advantageous.

U.S. Pat. No. 8,921,799 and pending application published as U.S. Pat. App. Pub. No. 2012/0187305 describe a general method and materials from the method relating to atomic layer deposition of a composite coating. Described herein is a method for and composition and product having ultrathin, amorphous, composite aluminum-tungsten-fluoride (AlW$_x$F$_y$) films on, in one embodiment, LiCoO$_2$ electrodes via ALD using, in one embodiment, trimethyalumninum (TMA) and tungsten hexafluoride (WF$_6$), at 50° C. to 300° C. preferably at 200° C. Such films are created with metal fluoride and do not utilize a metal oxide. There is no oxidant step involved in TMA-WF$_6$ process; TMA reduces tungsten terminated surface in various embodiments, AlW$_x$F$_y$C$_z$ is formed where x and y are any non-zero positive number and wherein z can be zero (no carbide), or any positive number. These films are highly conducting, but incorporate AlF$_3$ in the composite. Although LiCoO$_2$ is the most commercially successful cathode material for Li-ion batteries, the practical use of LiCoO$_2$ is limited, in part, to surface reactions involving cobalt dissolution, electrolyte oxidation, as well as structural transformations occurring at potentials higher than ~4.3 V (vs. Li/Li$^+$). As such, LiCoO$_2$ might be considered as a model system for surface studies on Li-ion cathodes. Ultrathin AlW$_x$F$_y$ coatings (~1 nm) on LiCoO$_2$ are shown to significantly increase stability relative to bare LiCoO$_2$ when cycled up to 4.4 V. These results reveal new possibilities for designing ultrathin and electrochemically robust coatings of metal fluorides via ALD, and potentially other techniques, to enhance the stability of Li-ion electrodes. Using high vapor pressure precursors are beneficial when implemented in role-to-role ALD or spatial ALD.

Figure 1A:
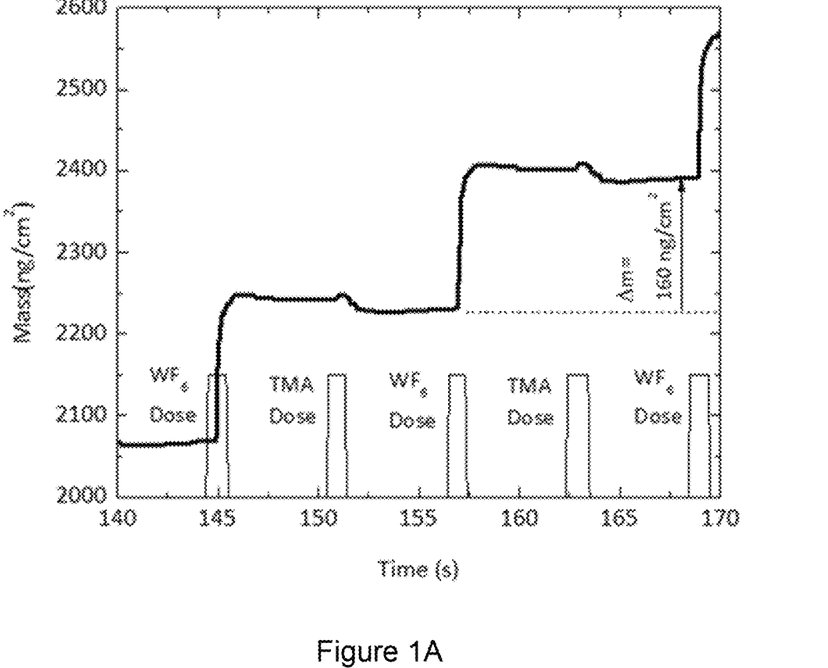
FIGS. 1A-B illustrate (FIG. 1A) in-situ QCM mass-uptake during two alternating cycles of $WF_6$ and TMA and (FIG. 1B) HRTEM image of the films deposited using alternating exposures to TMA-$WF_6$ on an ALD $Al_2O_3$-coated Si wafer (inset: NBD of the $AlW_xF_y$ film with beam size of ~50 nm).
Figure 7:
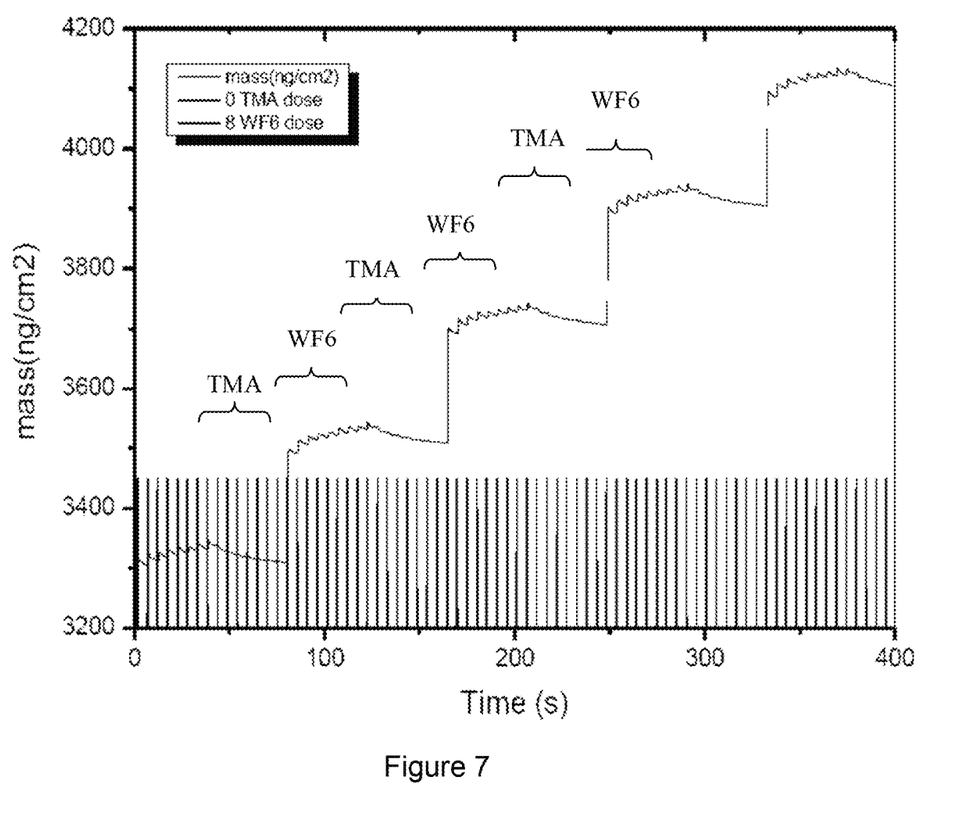
FIG. 7 illustrates the self-limiting growth of TMA-WF6 ALD.

ALD of AlW$_x$F$_y$ was accomplished using alternating exposures of WF$_6$ and TMA. In-situ quartz crystal microbalance (QCM) measurements recorded during alternating, 1 second WF$_6$ and TMA exposures at 200° C. showed a staircase pattern comprised of 160 ng/cm$^2$ steps consistent with layer-by-layer growth (FIG. 1A). Substrate temperature below 2000 is desirable when ALD is applied to electrode laminates composed of active material, carbon, and polymeric binder. Additional QCM measurements verified that each of the precursor exposures was self-limiting under these conditions. FIG. 7 illustrates the self-limiting growth of TMA-WF$_6$ ALD. Ellipsometric measurements indicated a growth rate of 2.56 Å/cycle, and combined with the QCM data yield a film density of 6.5 g/cm$^3$. The resulting films appear amorphous by X-ray diffraction are highly conducting; four-point probe measurements give a resistivity of 3.5×10$^{-2}$ Ωcm. The growth rate of the film, deposited by alternating cycles of TMA-WF$_6$, is relatively high compared to that of typical oxides (~1-1.5 Å/cycle) and is due in part to tungsten and/or tungsten carbide byproducts that have growth rates of 2.5 Å/cycle.

Figure 1B:
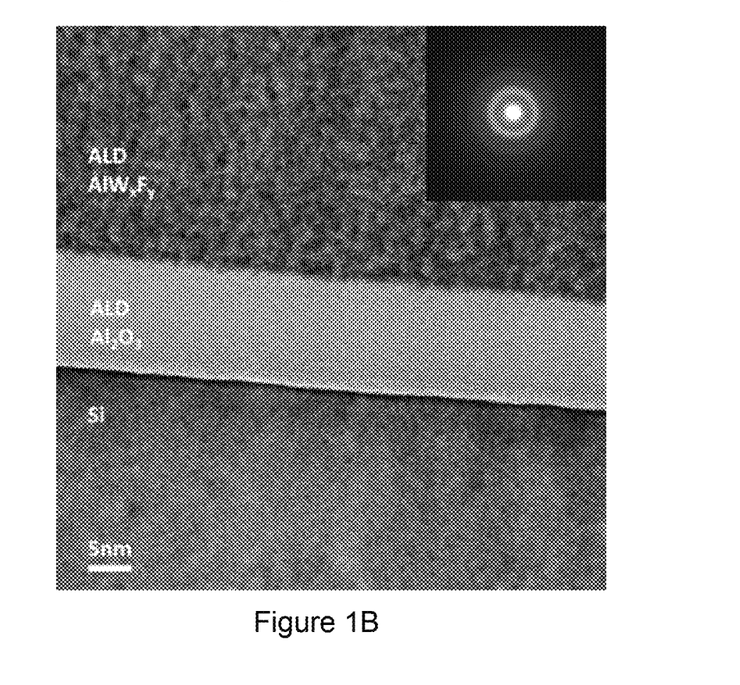
Figure 5:
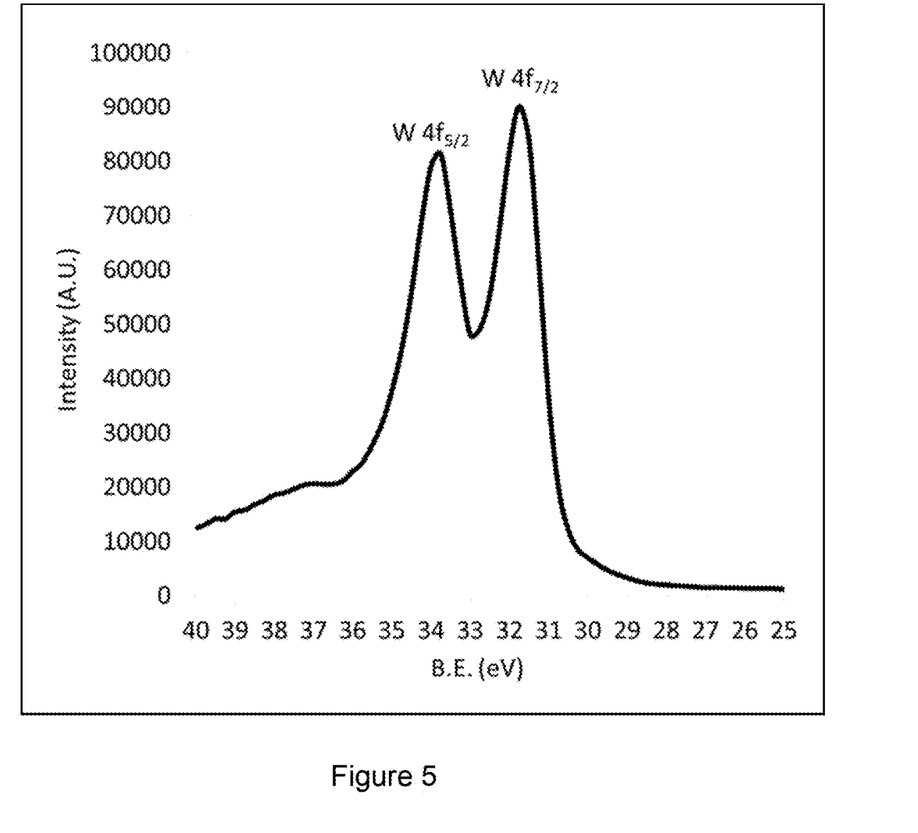
FIG. 5 shows XPS spectrum of tungsten in the ALD AlW$_x$F$_y$ film deposited on silicon

X-ray photoelectron spectroscopy (XPS) survey scans, performed during depth-profiling of these films deposited on silicon, revealed that they are comprised of W, C, Al, and F. Higher resolution XPS analysis demonstrated that the Al and F are bound as AlF$_3$, and that the W may be present as both metallic W and tungsten carbide (WC$_x$) (See FIG. 5). For brevity, in this application these films are referred to as AlW$_x$F$_y$ or AlW$_x$F$_y$C$_z$ where z may equal zero to reflect that carbide may or may not be included. High resolution transmission electron microscopy (HRTEM) and nano-beam diffraction (NBD) measurements, taken from cross-sections of an AlW$_x$F$_y$ film deposited on Al$_2$O$_3$-coated silicon (FIG. 1B), confirmed the amorphous nature of the films. These measurements also revealed that the AlW$_x$F$_y$ exists as a nanocomposite of ~1 nm particles in a matrix of lower density. It is believed that the darker particles in FIG. 1B are W and WC$_x$, while the surrounding matrix of lower density material is AlF$_3$. In one embodiment, particles are uniformly dispersed in the matrix from TEM, but can be controlled by ALD sequence; WF6-WF6 pulsing might generate localized nanoparticles. It is believed that TMA pulse on WF6 terminated surface reduces tungsten to form metallic or carbide form while fluorine create stable bonding with Al.

Figure 2A:
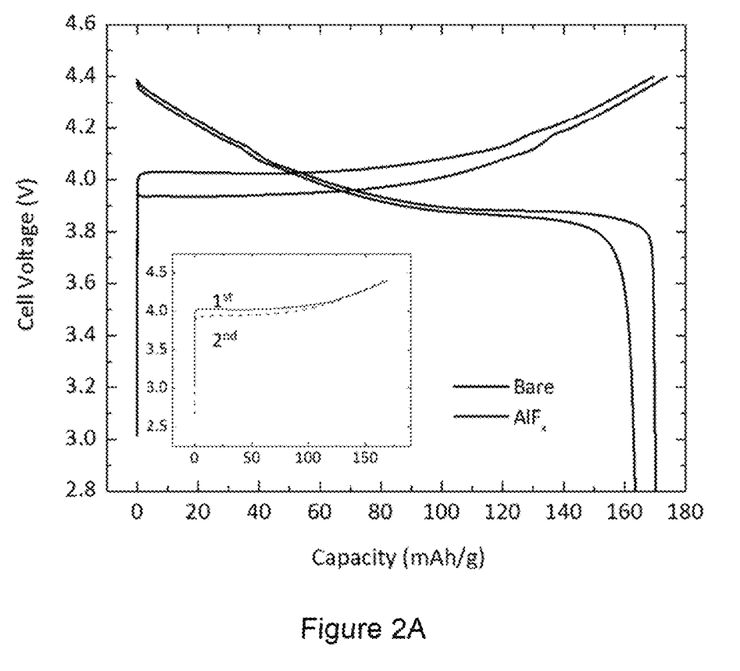
Figure 2B:
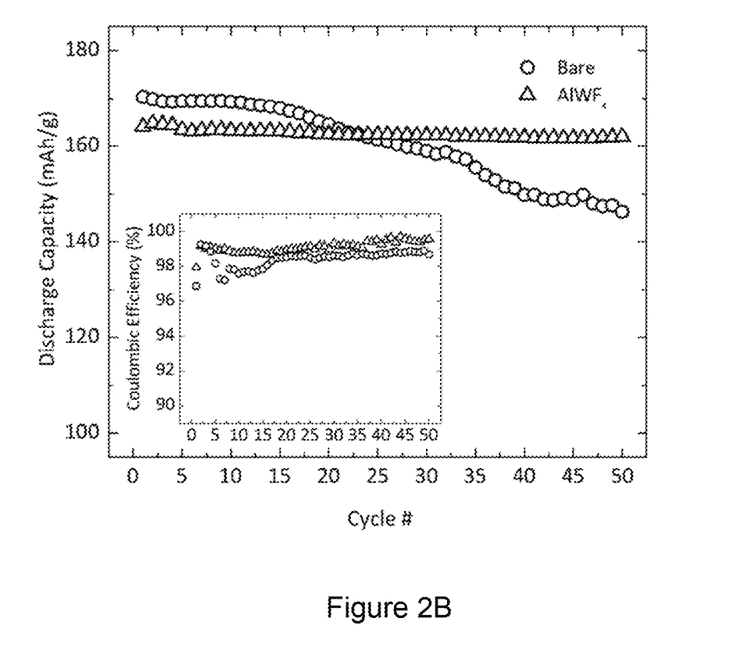
Figure 6:
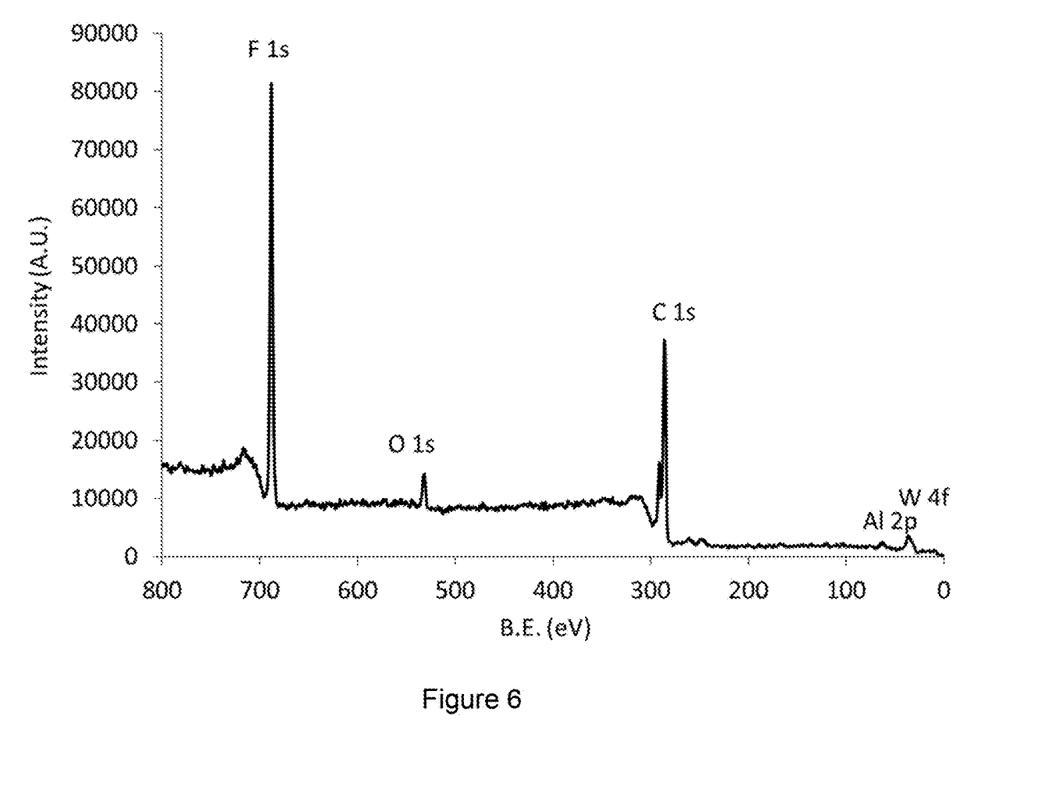
FIG. 6 shows XPS survey spectrum of ALD AlW$_x$F$_y$ film deposited on LiCoO$_2$ laminate.
Figure 8:
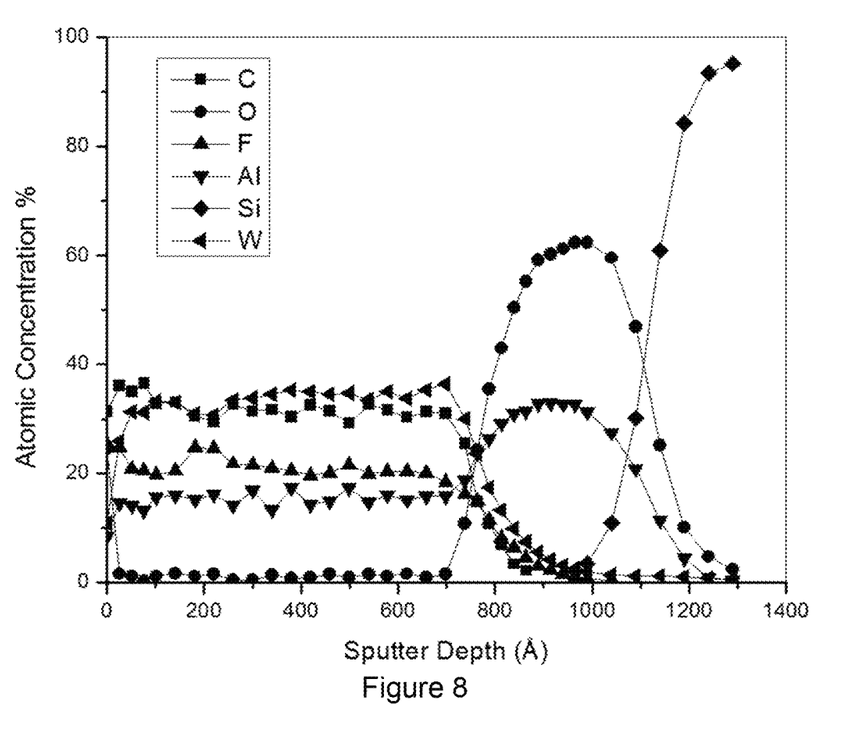
FIG. 8 illustrates characterization of an ALD coated AlW$_x$F$_y$ layer.

To evaluate the electrochemical properties of the AlW$_x$F$_y$ coating, 5 ALD cycles of TMA-N$_2$—WF$_6$—N$_2$ (~1 nm) were applied on laminates of LiCoO$_2$. XPS survey scan of coated LiCoO$_2$ confirmed that the AlW$_x$F$_y$ films are deposited on the laminates (FIG. 6). FIG. 8 illustrates characterization of a ALD coated ALW$_x$F$_y$C$_z$ layer. FIG. 2A shows first-cycle voltage profiles of two Li$^+$/LiCoO$_2$ cells, with and without AlW$_x$F$_y$ coatings, between 4.4-2.5 V at 20 mA/g. Uncoated LiCoO$_2$ exhibited first-cycle capacities of ~170 mAh/g compared to ~165 mAh/g of the coated sample. This difference, though fairly negligible, might be attributed to the inactive nature of the coating layer resulting in slightly higher first-cycle impedance. The polarization on charging, however, disappeared after the first cycle indicating possible changes, such as a lithiated phase in the film, allowing diffusion of lithium ions and similar lithium extraction/insertion voltages as the uncoated electrode (inset FIG. 2A). Recent molecular dynamics (MD) calculations on Al$_2$O$_3$ coating suggests that the Al$_2$O$_3$ coating layer absorbs lithium until it reaches the thermodynamically stable composition during the lithiation process. The characteristic hexagonal to monoclinic transformation of LiCoO$_2$ occurring at ~4.1 V is observed for both cells, though slightly less pronounced for the coated electrode. This is an indication that the ALD coating process did not drastically alter the bulk characteristics of the material; similar to previous coating studies on LiCoO$_2$. The discharge capacity of the uncoated LiCoO$_2$ continuously decreased while the coated electrode showed excellent capacity retention over the course of cycling between 4.4-2.5 V. The bare LiCoO$_2$ retained only 85% of its initial capacity, while the 1 nm AlW$_x$F$_y$ coating enabled a 99% capacity retention after 50 charge-discharge cycles as shown FIG. 2B. The capacity loss of the bare material is attributed to parasitic, interfacial reactions as previously reported. It should be noted that thicker (~10 nm) AlW$_x$F$_y$ coatings on LiCoO2 showed discharge capacities of just ~10 mAh/g, revealing a limitation in practical thicknesses. There is a trade-off between protection capability and facile diffusion of lithium ion. A 1 nm thick AlW$_x$F$_y$ allows diffusion of lithium and protect underlying electrodes.

Figure 3A:
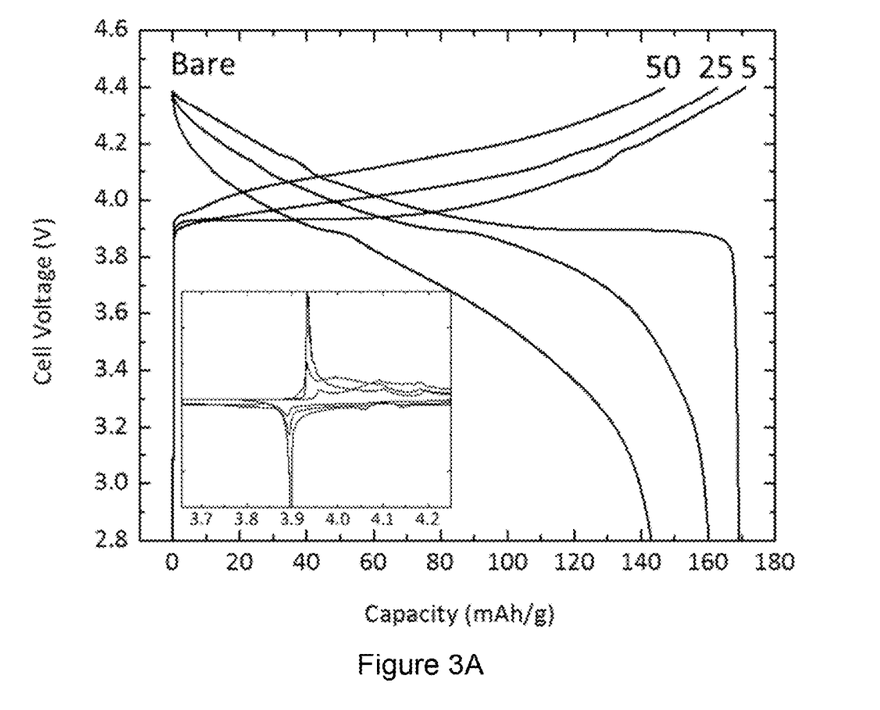
FIGS. 3A-C show Voltage profiles of (FIG. 3A) bare and (FIG. 3B) AlW$_x$F$_y$ coated LiCoO$_2$ on cycles 5, 25, and 50 and corresponding dQ/dV plots of bare and coated LiCoO$_2$ (inset), as well as (FIG. 3C) Al2p XPS spectra of AlW$_x$F$_y$-coated LiCoO$_2$ before and after 50$^{th}$ cycle.
Figure 3B:
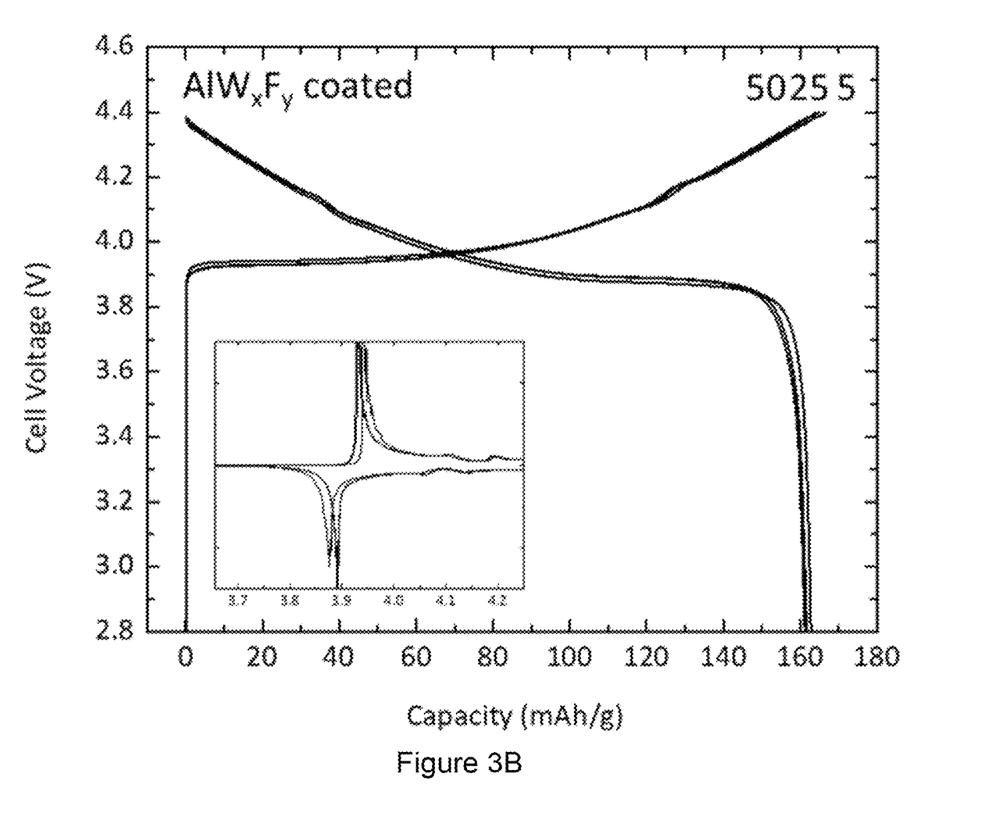
Figure 3C:
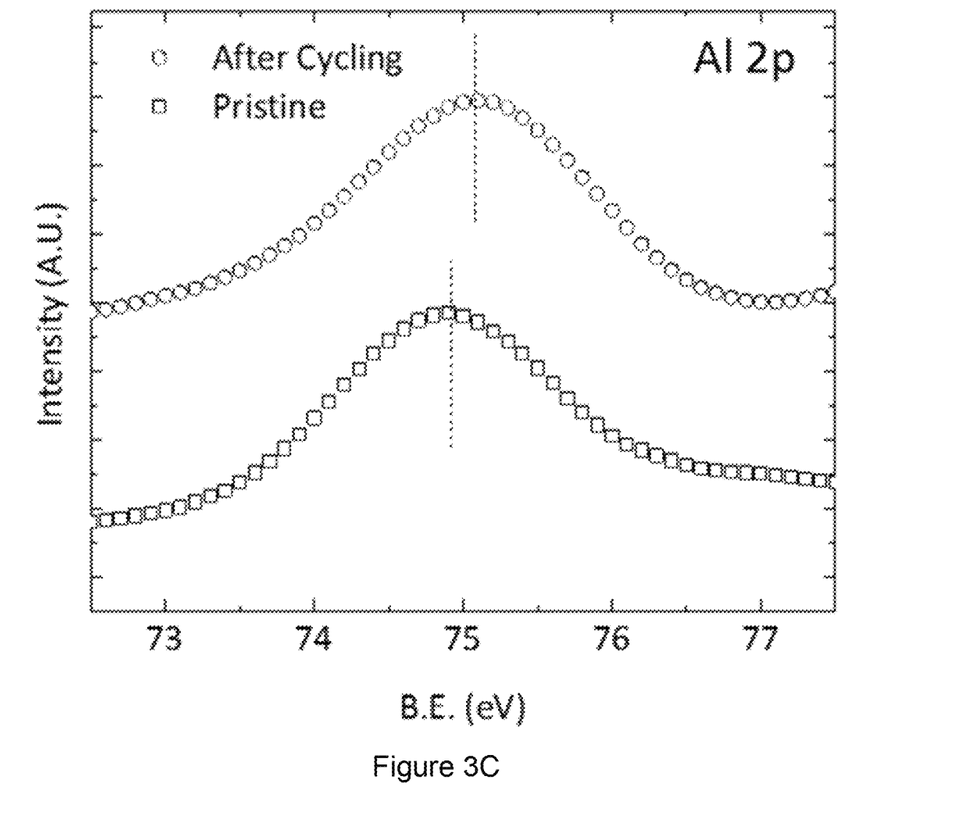

FIGS. 3A and 3B show voltage profiles and corresponding differential capacity (dQ/dV) plots of bare and coated samples on cycles 5, 25, and 50. Voltage profiles of the uncoated LiCoO$_2$ clearly showed increased polarization on charge and discharge with continued cycling accompanied by a broadening and shifting of the dQ/dV peaks; typical of increasing impedance and structural degradation. On the other hand, voltage profiles and dQ/dV plots of the AlW$_x$F$_y$-coated material showed little change upon cycling. This data reveals that the phase transition associated with lithium ordering at ~4.1 V is a relatively "soft" transition and a significant fraction of the lithium can be repeatedly, and reversibly, extracted without significant damage to the bulk of the structure. Furthermore, it is clear that surface damage, mitigated here by the AlW$_x$F$_y$ film, is a much greater factor in the degradation of LiCoO$_2$ under these cycling conditions. XPS studies were employed on AlW$_x$F$_y$-coated materials to probe the chemical composition of the surface before/after the electrochemical cycling. FIG. 3C shows Al 2p$_{3/2}$ spectra of pristine, coated LiCoO$_2$ and after 50 cycles. The binding energy of the pristine and cycled samples was fitted to 74.9 eV and 75.0 eV, respectively, indicating only marginal change in the binding energy after electrochemical cycling and a stable AlW$_x$F$_y$ coating under insertion/extraction of lithium. The fitted value is higher than those of Al$_2$O$_3$ (74.2 eV) and LiAlO$_2$ (73.4 eV), and is closer to O—Al—F bonding as reported earlier.

Figure 4:
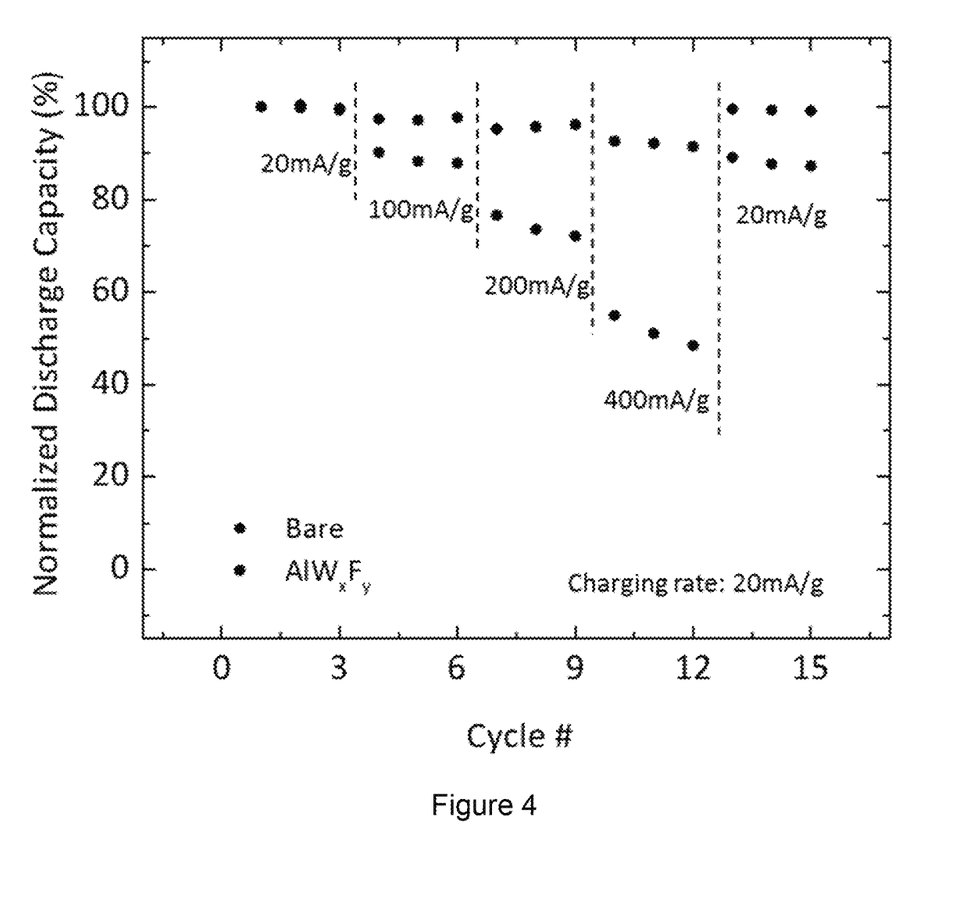
FIG. 4 illustrates rate capabilities of bare (black) and AlW$_x$F$_y$-coated (red) LiCoO$_2$ electrodes.

FIG. 4 compares the rate capability up to 400 mA/g for the coated and uncoated LiCoO$_2$. AlW$_x$F$_y$-coated LiCoO$_2$ exhibited superior rate capability at all current rates compared to the uncoated material, but the most dramatic improvements occurred at the highest rates (200-400 m A/g). Discharge capacities at a current of 400 mA/g were 51% and 92% of the first-cycle capacities for bare and AlW$_x$F$_y$ materials respectively. It is well known that reactions at electrode/electrolyte interfaces result in surface films that greatly increase cathode electrode impedances, thereby, causing capacity fade and poor power performance. Furthermore, it has been shown, in agreement with our results in FIG. 3B, that mitigating reactions at the surface of LiCoO$_2$ results in more stable bulk processes. As such, the data herein clearly demonstrate the improved surface stability of AlW$_x$F$_y$-coated LiCoO$_2$, resulting in excellent electrochemical performance.

Figure 9:
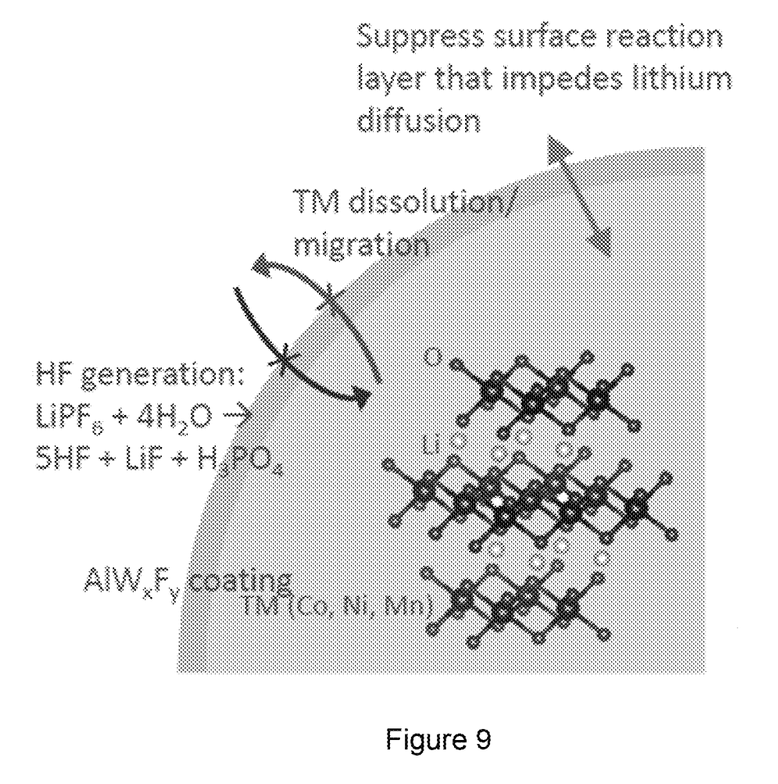
FIG. 9 illustrates the interactions of the layers in one embodiment demonstrating the resistance to diffusion of lithium.

FIG. 9 illustrates the interactions of the layers in one embodiment demonstrating the resistance to diffusion of lithium. The AlWxFyCz coating resists HF and transition metal dissolution from the cathode.

Figure 10:
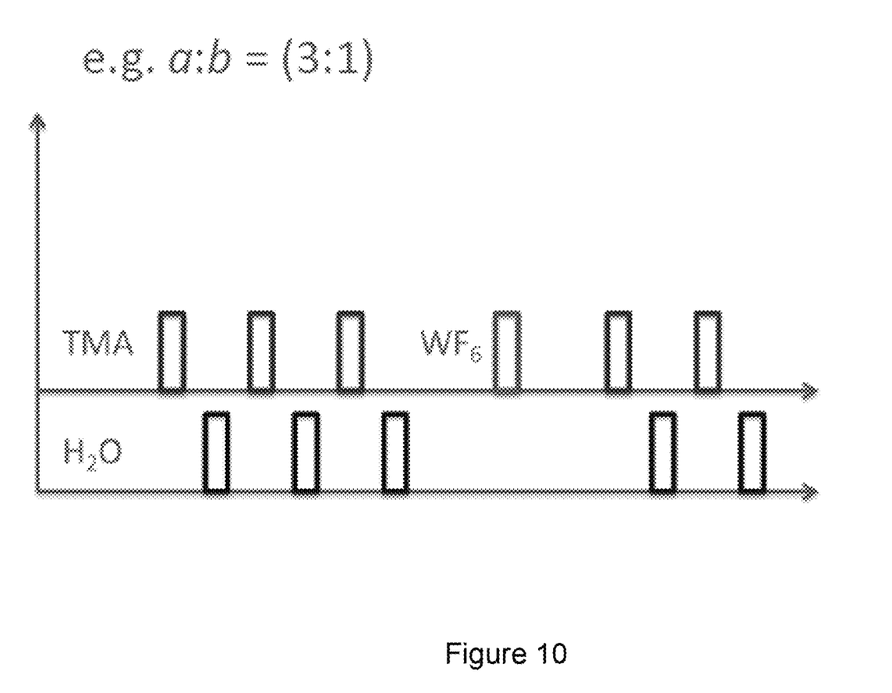
FIG. 10 is a graph illustrating the sequence of cycles in one embodiment where a 3:1 cycle sequence is applied.
Figure 11:
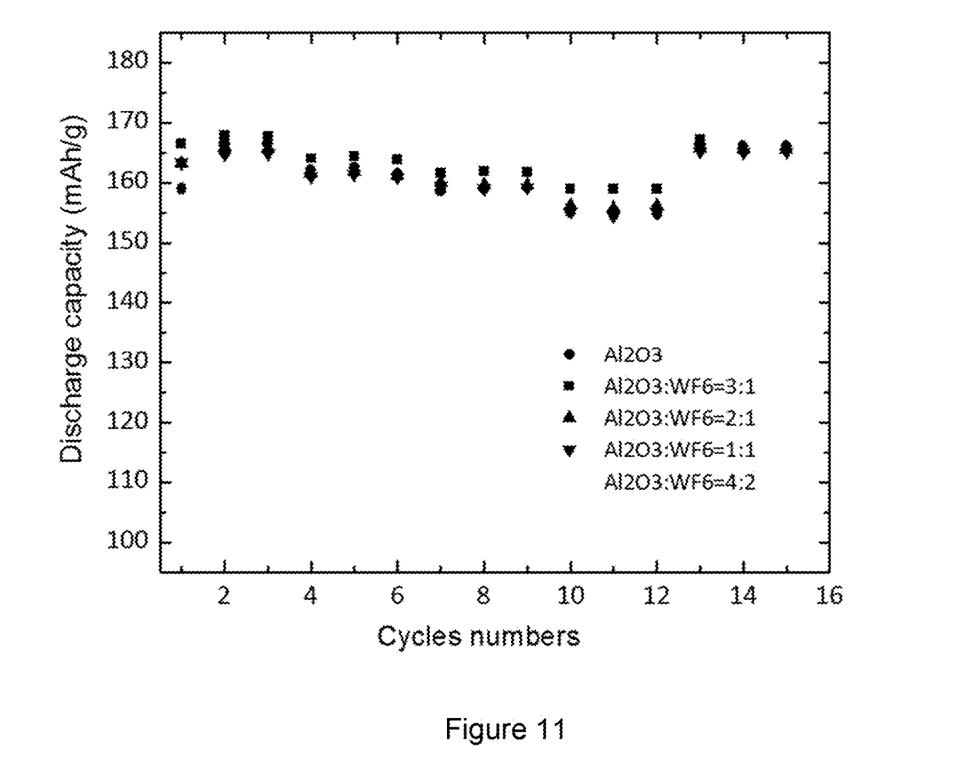
FIG. 11 illustrates a graph of the number of supercycles for various ratios demonstrating a similar thickness with different compositions resultant from the differing ratios.

Various cycles and supercycle arrangements can be utilized. FIG. 10 is a graph illustrating the sequence of cycles in one embodiment where a 3:1 cycle sequence is applied. FIG. 11 illustrates a graph of the number of supercycles for various ratios demonstrating a similar thickness with different compositions resultant from the differing ratios. Generally, the ALD supercycle comprises (a[TMA-H2O]*bWF6)×n=total number. In that supercycle, a and b can be, for example, 3:1, 2:1, 1:1, 4:2. The total thickness may be the same for different compositions by varying the a:b ratio. For example, (3:1)×3, (2:1)×4, (1:1)×6, (4:2)×2~ similar thickness with different compositions.

In summary, a novel ALD process allowing the deposition of metal fluoride materials has been developed for surface protection of Li-ion battery electrodes. A ~1 nm AlW$_x$F$_y$ film deposited on LiCoO$_2$ electrodes has been shown to dramatically enhance cycle life and rate capability of Li$^+$/LiCoO$_2$ cells. These AlW$_x$F$_y$ thin film composites appear to combine the chemical inertness of AlF$_3$ with the high electrical conductivity of a metal. This study suggests new opportunities for ALD and the design of advanced surface structures enabling high capacity lithium ion batteries. Moreover, adjusting the composition of the ALD composites may yield further improvements in performance.

Atomic Layer Deposition: Aluminum fluoride-based composite films were deposited via sequential pulsing of trimethylalumium (TMA) (97%, Sigma Aldrich) and tungsten hexafluoride (WF$_6$) (99.8%, Sigma Aldrich). The deposition was performed at 200° C. in a hot-walled viscous flow ALD reactor. TMA and WF$_6$ precursors were maintained at room temperature and ultrahigh purity N$_2$ was used as a carrier gas with 300 sccm. The base pressure of the ALD reaction chamber was maintained at ~1.0 Torr. TMA and WF$_6$ were alternatively pulsed into the 15 sccm of N$_2$ carrier flow with the following time sequence: 1 s WF$_6$ dose—5 s purge—1 s TMA dose—5 s purge. An in situ QCM study was performed to study the nature of the deposition. The QCM measurements typically used longer N$_2$ purge times of 10 s to allow the QCM signal to stabilize after each precursor exposure. The thicknesses of AlW$_x$F$_y$ coating layers were determined by ex situ spectroscopic ellipsometry using a Cauchy model (Alpha-SE, J. A. Woollam Co.). The resistance of the film deposited on fused silica was determined by performing current-voltage (I-V) measurements using a four point probe measurement (Keithley Model 6487 current voltage source). X-ray photoelectron spectroscopy of AlW$_x$F$_y$ films deposited on silicon was performed by Evans Analytical Group.

Transmission electron microscopy: Microstructure and crystallinity of AlW$_x$F$_y$ films deposited on silicon wafer were analyzed using TEM. TEM analysis was performed by Evans Analytical Group (Sunnyvale, CA). Cross-section TEM samples were prepared using the in-situ focused ion beam (FIB) lift out technique on an FEI Strata Dual Beam FIB/SEM. The samples were capped with a protective layer of carbon prior to FIB milling, and were imaged with a FEI Tecnai TF-20 FEG/TEM operated at 200 kV in bright-field (BF) TEM mode, high-resolution (HR) TEM mode, and nano-beam diffraction (NBD) mode.

Electrochemical measurements: The $LiCoO_2$ electrodes were prepared by mixing a slurry of commercial $LiCoO_2$ powder (Sigma-Aldrich), Super-P carbon, and polyvinylidenedifluoride (PVDF) with a mass ratio of 84:8:8 in N-methyl pyrrolidone (NMP). The mixed slurry was caste on an aluminum foil current collector. $AlW_xF_y$ films were deposited via ALD on the finished electrode laminates with thicknesses of ~1 nm. 2032-type coin cells were assembled in an Ar-filled glovebox (water and oxygen ≤1 ppm) with metallic lithium anodes. The electrolyte consisted of a 1.2M $LiPF_6$ solution in ethylene carbonate and ethylmethyl carbonate (3:7 mixture). Charge-discharge measurements were recorded on a MACCOR potentiostat at room temperature under a current rate of 20 mA/g between 2.5 V and 4.4 V. Rate capability experiments were conducted with a constant charge rate of 20 mA/g and discharge rates of 20, 100, 200, and 400 mA/g.

X-ray photoelectron spectroscopy: The chemical state of aluminum before and after electrochemical cycling was analyzed by XPS (Sigma Probe: Thermo VG Scientific) with monochromatic Al Kα radiation (1486.6 eV). The cycled 2032 coin cells were disassembled and washed with dimethyl carbonate (DMC), and transferred directly to XPS to eliminate air-exposure during sample transport.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A composition of matter comprising:
   metallic W particles disposed in an $AlF_3$ matrix and excluding oxygen; and
   tungsten carbide particles disposed in the $AlF_3$ matrix.

2. The composition of matter of claim 1, wherein the composition has a chemical formula $AlW_xF_yC_z$ where x>0, y>0 and z>0.

3. The composition of matter of claim 1, wherein the $AlF_3$ matrix is amorphous.

4. The composition of matter of claim 1, wherein the composition has a resistivity of $3.5 \times 10^{-2}$ Ωcm.

5. The composition of matter of claim 1, wherein the metallic W particles have a size of 1 nm.

6. The composition of matter of claim 1, wherein the metallic W particles are uniformly disposed in the $AlF_3$ matrix.

7. The composition of matter of claim 1, wherein the composition has a density of 6.5 g/cm³.

8. The composition of matter of claim 1, wherein the $AlF_3$ matrix has a first density and the metallic W particles have a second density greater than the first density.

* * * * *